US012336259B2

(12) United States Patent
Yoo et al.

(10) Patent No.: US 12,336,259 B2
(45) Date of Patent: Jun. 17, 2025

(54) ELECTRONIC DEVICE INCLUDING TWO-DIMENSIONAL MATERIAL AND METHOD OF FABRICATING THE SAME

(71) Applicant: Samsung Electronics Co., Ltd., Suwon-si (KR)

(72) Inventors: Minseok Yoo, Suwon-si (KR); Minsu Seol, Seoul (KR); Junyoung Kwon, Seoul (KR); Kyung-Eun Byun, Seongnam-si (KR); Hyeonjin Shin, Suwon-si (KR); Van Luan Nguyen, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 647 days.

(21) Appl. No.: 17/545,373

(22) Filed: Dec. 8, 2021

(65) Prior Publication Data

US 2022/0406911 A1    Dec. 22, 2022

(30) Foreign Application Priority Data

Jun. 22, 2021   (KR) .................. 10-2021-0081032

(51) Int. Cl.
*H10D 64/27* (2025.01)
*H01L 21/02* (2006.01)
*H10D 30/47* (2025.01)
*H10D 30/67* (2025.01)
*H10D 62/80* (2025.01)
*H10D 64/60* (2025.01)

(52) U.S. Cl.
CPC ....... *H10D 64/513* (2025.01); *H10D 30/6735* (2025.01); *H10D 64/60* (2025.01)

(58) Field of Classification Search
CPC ........... H01L 29/4236; H01L 29/42392; H01L 29/43; H01L 29/778; H01L 29/78681;
(Continued)

(56) References Cited

U.S. PATENT DOCUMENTS 10,163,932 B1 * 12/2018 Sinitskii ................. H10N 70/20
11,018,001 B2    5/2021 Kim et al.
(Continued)

FOREIGN PATENT DOCUMENTS

CN        108666358 A    10/2018
JP        2017/145184 A    8/2017
(Continued)

OTHER PUBLICATIONS

Steven P. Harvey et al., "Defect chemistry and chalcogen diffusion in thin-film Cu2ZnSnSe4 materials" *Journal of Applied Physics*, vol. 117, 2015, pp. 074902-1-074902-7.
(Continued)

*Primary Examiner* — Herve-Louis Y Assouman
(74) *Attorney, Agent, or Firm* — HARNESS, DICKEY & PIERCE, P.L.C.

(57) ABSTRACT

Disclosed are an electronic device including a two-dimensional material, and a method of fabricating the electronic device. The electronic device may include a first metal layer including a transition metal, a second metal layer on the first metal layer and including gold (Au), and a two-dimensional material layer between the first metal layer and the second metal layer. The two-dimensional material layer may include a transition metal dichalcogenide (TMD). The two-dimensional material layer may be formed as a chalcogen element diffuses into the second metal layer and reacts with the transition metal of the first metal layer adjacent to the second metal layer.

25 Claims, 37 Drawing Sheets

(58) Field of Classification Search
CPC ............... H01L 29/24; H01L 21/0242; H01L 21/02614; H01L 21/02568; H01L 21/02491; H01L 21/0259; H01L 21/02505; H01L 21/02502

See application file for complete search history.

(56) References Cited

U.S. PATENT DOCUMENTS

| | | | |
|---|---|---|---|
| 2016/0047059 A1* | 2/2016 | Kim | C01B 19/00 117/7 |
| 2017/0250075 A1* | 8/2017 | Caymax | H01L 21/02488 |
| 2017/0345944 A1* | 11/2017 | Lin | H01L 29/267 |
| 2018/0047784 A1* | 2/2018 | Ohba | H10N 70/883 |
| 2018/0226248 A1* | 8/2018 | Jahangir | H01L 29/66742 |
| 2019/0074380 A1 | 3/2019 | Park et al. | |
| 2019/0123149 A1* | 4/2019 | Lee | H10K 59/1213 |
| 2020/0006541 A1* | 1/2020 | Lin | H01L 29/66969 |
| 2023/0062389 A1* | 3/2023 | Shen | H01L 29/778 |

FOREIGN PATENT DOCUMENTS

| | | |
|---|---|---|
| JP | 2018/100429 A | 6/2018 |
| KR | 2019/0063064 A | 6/2019 |
| KR | 101993365 B1 | 6/2019 |
| KR | 2020/0131391 A | 11/2020 |
| WO | WO-2018/087281 A1 | 5/2018 |

OTHER PUBLICATIONS

Desheng Kong et al., "Synthesis of MoS$_2$ and MoSe$_2$ Films with Vertically Aligned Layers" *Nano Letters*, vol. 13, Feb. 2013, pp. 1341-1347.

Hyun Ho Kim et al., "Wetting-Assisted Crack- and Wrinkle-Free Transfer of Wafer-Scale Graphene onto Arbitrary Substrates over a Wide Range of Surface Energies" *Advanced Functional Materials*, vol. 26, 2016, pp. 2070-2077.

Woosuk Choi et al., "Influence of removing PMMA residues on surface of CVD graphene using a contact-mode atomic force microscope" *RSC Advances*, vol. 7, 2017, pp. 6943-6949.

Yuan Liu et al., "Approaching the Schottky-Mott limit in van der Waals metal-semiconductor junctions" *Nature*, vol. 557, May 2018, pp. 696-712.

Abhay Shivayogimath et al., "A universal approach for the synthesis of two-dimensional binary compounds" *Nature Communications*, 10:2957, 2019.

Hao-Ting Chin et al., "Ultra-thin 2D transition metal monochalcogenide crystals by planarized reactions" *npj 2D Materials and Applications*, 5:28, 2021.

* cited by examiner

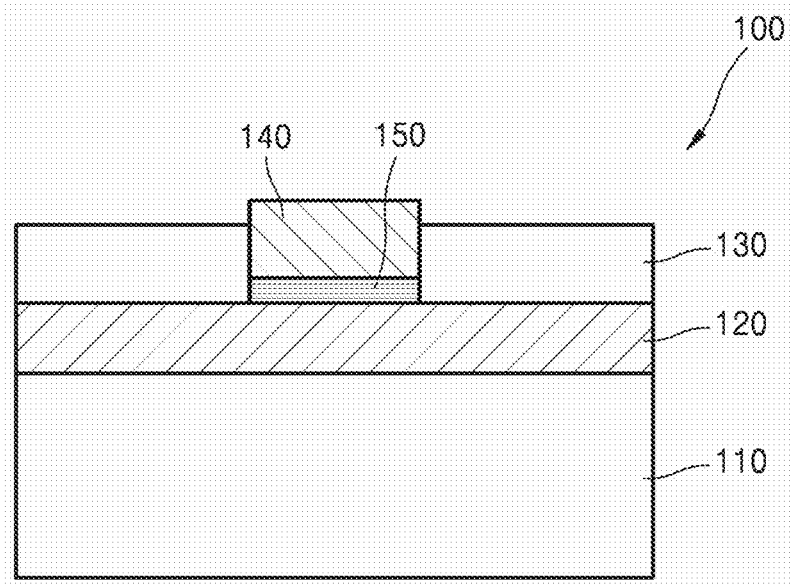

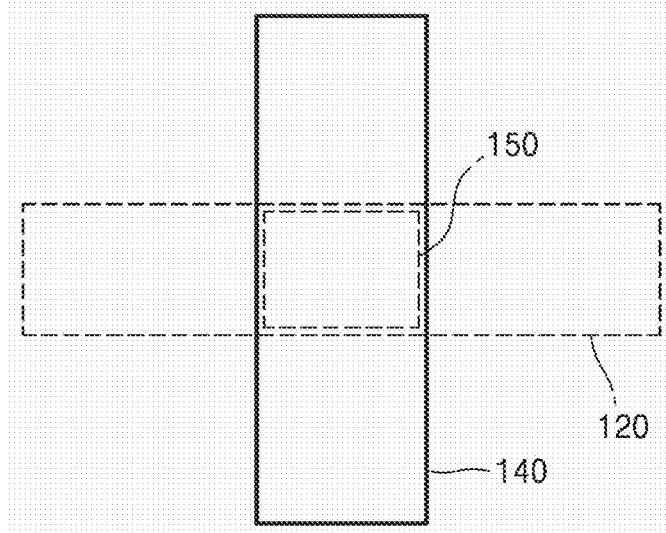

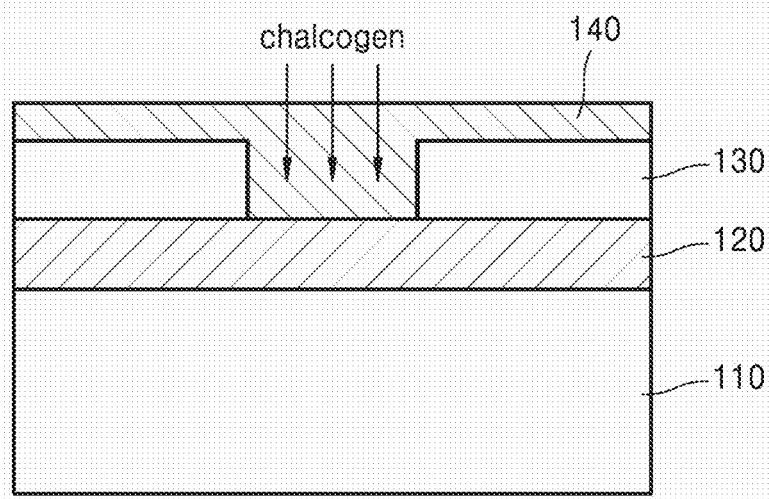

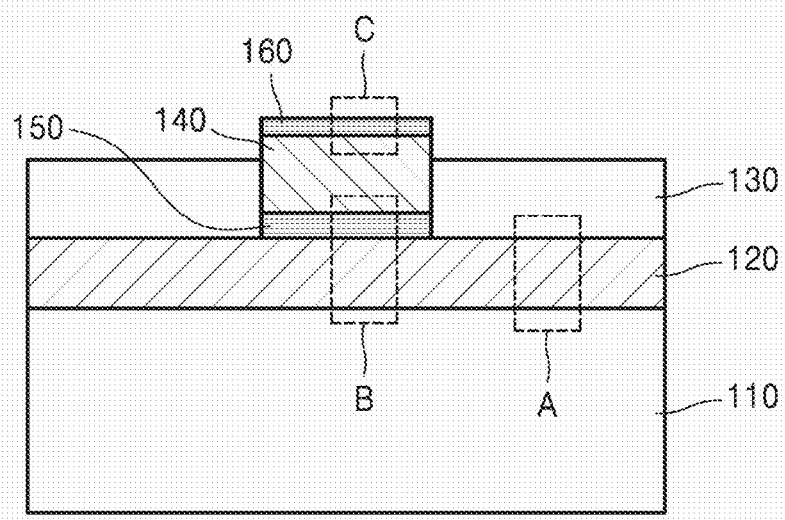

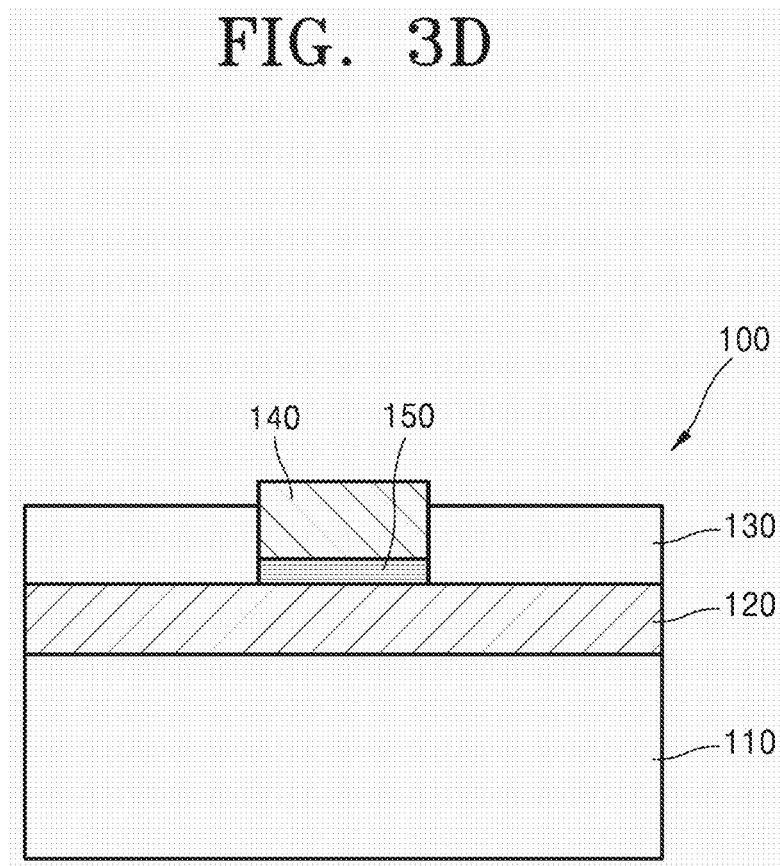

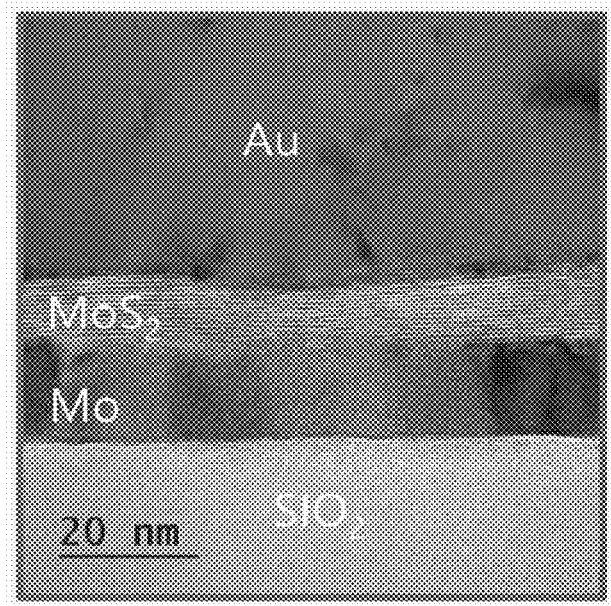

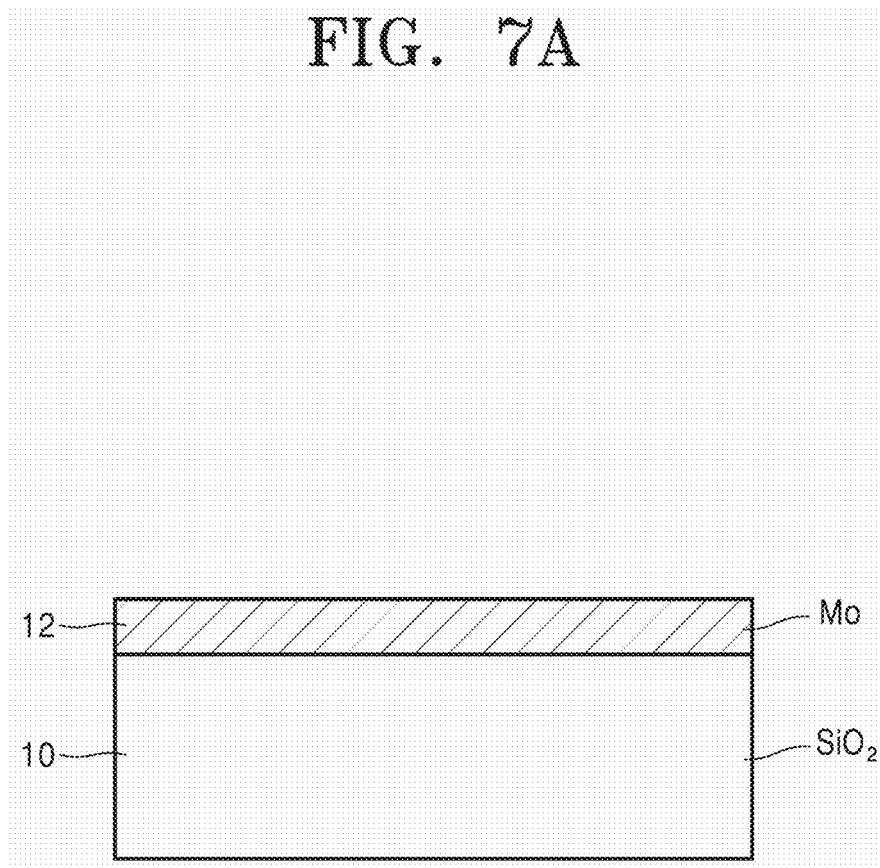

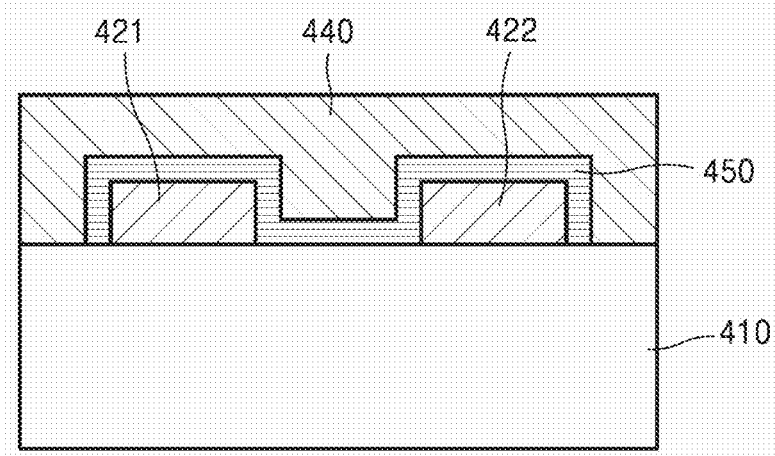

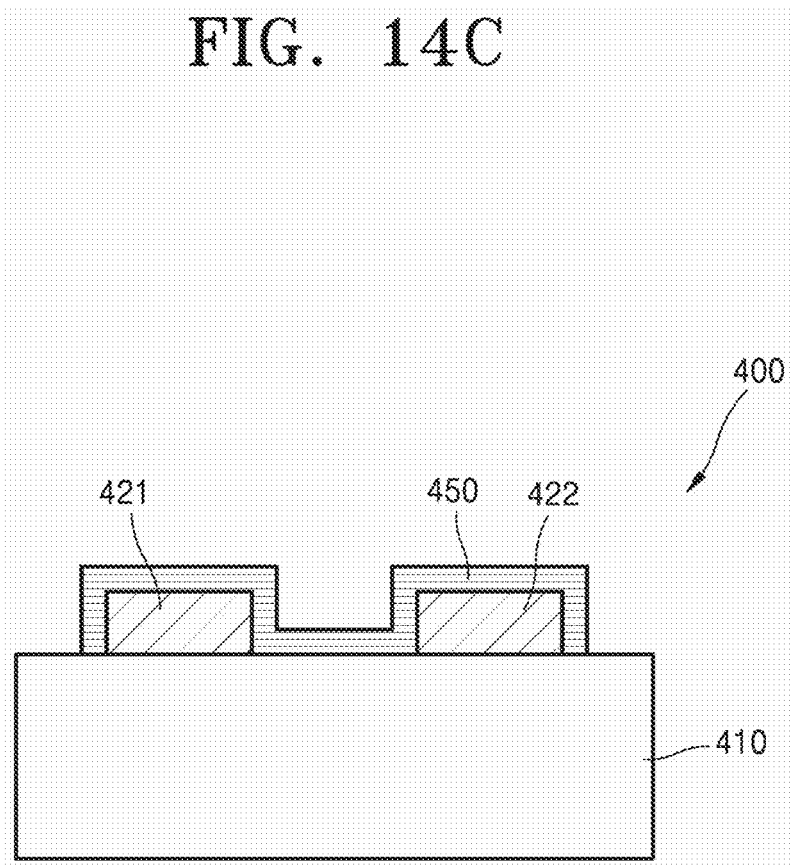

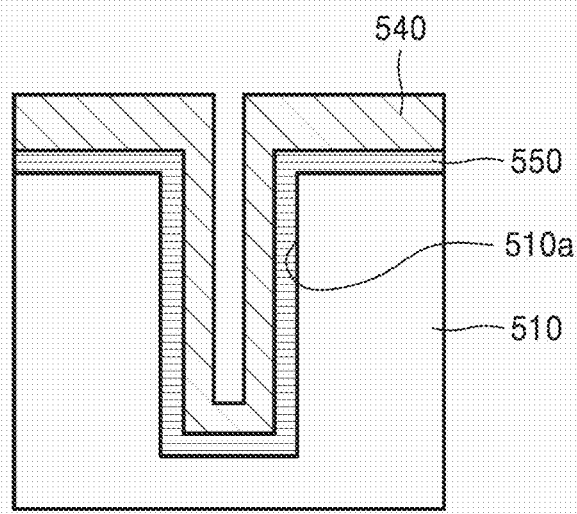

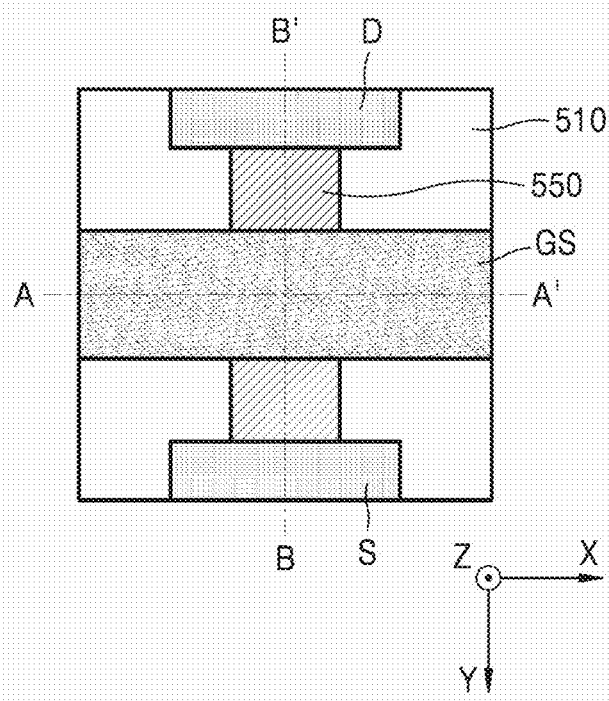

ELECTRONIC DEVICE INCLUDING TWO-DIMENSIONAL MATERIAL AND METHOD OF FABRICATING THE SAME

CROSS-REFERENCE TO RELATED APPLICATION

This application is based on and claims priority under 35 U.S.C. § 119 to Korean Patent Application No. 10-2021-0081032, filed on Jun. 22, 2021, in the Korean Intellectual Property Office, the disclosure of which is incorporated by reference herein in its entirety.

BACKGROUND

1. Field

The present disclosure relates to electronic devices including two-dimensional materials, and/or methods of fabricating the electronic devices.

2. Description of the Related Art

Two-dimensional materials, which are materials having a two-dimensional crystal structure, have good electrical properties and maintain high mobility without changes in properties even when the thicknesses of the two-dimensional materials are reduced to nanoscale. Thus, the two-dimensional materials may be applied to various devices. Processes such as a two-dimensional material transfer process, a photo process, and a metal deposition process are required to fabricate devices based on such two-dimensional materials. However, such processes may increase the defect density of two-dimensional materials.

SUMMARY

Provided are electronic devices including two-dimensional materials, and methods of fabricating the electronic devices.

Additional aspects will be set forth in part in the description that follows and, in part, will be apparent from the description, or may be learned by practice of the presented embodiments of the disclosure.

According to an embodiment, an electronic device may include a first metal layer including a transition metal; a second metal layer on the first metal layer and including gold (Au); and a two-dimensional material layer between the first metal layer and the second metal layer and including a transition metal dichalcogenide (TMD).

In some embodiments, the two-dimensional material layer may be formed as a chalcogen element diffuses into the second metal layer and reacts with the transition metal of the first metal layer, adjacent to the second metal layer.

In some embodiments, the transition metal may include at least one selected from the group consisting of Mo, W, Nb, V, Ta, Ti, Zr, Hf, Co, Tc, and Re. The chalcogen element may include at least one selected from the group consisting of S, Se, and Te.

In some embodiments, the electronic device may further include a barrier layer around the second metal layer and the two-dimensional material layer. The barrier layer may be configured to limit and/or prevent diffusion of the chalcogen element.

In some embodiments, the barrier layer may include silicon oxide, aluminum oxide, hafnium oxide, or quartz.

In some embodiments, the two-dimensional material layer may include a single-material layer or the two-dimensional material layer may include a composite-material layer including different two-dimensional materials.

According to an embodiment, an electronic device may include a substrate; a first metal layer and a second metal layer apart from each other on the substrate and each including a transition metal; and a two-dimensional material layer including a transition metal dichalcogenide (TMD). The two-dimensional material layer may be parallel to the substrate and may connect the first metal layer and the second metal layer to each other.

In some embodiments, the two-dimensional material layer may be formed from a third metal layer between the first metal layer and the second metal layer. The two-dimensional material layer may be formed as a transition metal of the third metal layer reacts with a chalcogen element.

In some embodiments, the transition metal may include at least one selected from the group consisting of Mo, W, Nb, V, Ta, Ti, Zr, Hf, Co, Tc, and Re. The chalcogen element may include at least one selected from the group consisting of S, Se, and Te.

In some embodiments, the two-dimensional material layer may cover the first metal layer, the second metal layer, and a portion of the substrate between the first metal layer and the second metal layer.

According to an embodiment, a method of fabricating an electronic device may include forming a first metal layer including a transition metal on a substrate; forming a second metal layer including gold (Au) on the first metal layer; diffusing a chalcogen element into the second metal layer; and forming a two-dimensional material layer including a transition metal dichalcogenide (TMD) by reacting the chalcogen element with the transition metal of the first metal layer adjacent to the second metal layer.

In some embodiments, the method may further include forming a patterned barrier layer on the first metal layer. The second metal layer may be formed to cover the patterned barrier layer and a portion of the first metal layer that is exposed by the patterned barrier layer through an opening in the patterned barrier layer.

In some embodiments, the transition metal may include at least one selected from the group consisting of Mo, W, Nb, V, Ta, Ti, Zr, Hf, Co, Tc, and Re. The chalcogen element may include at least one selected from the group consisting of S, Se, and Te.

According to an embodiment, a method of fabricating an electronic device may include forming a transition metal layer on a substrate, the transition metal layer including a first metal layer, a second metal layer, and a third metal layer, the third metal layer connecting the first metal layer and the second metal layer to each other; forming a fourth metal layer including gold (Au) to cover the transition metal layer; diffusing a chalcogen element into the fourth metal layer; forming a two-dimensional material layer including a transition metal dichalcogenide (TMD) by reacting the chalcogen element with the transition metal layer; and removing the fourth metal layer.

In some embodiments, the third metal layer may be thinner than the first metal layer and the second metal layers such that the third metal layer may entirely react with the chalcogen element and may be entirely converted into a two-dimensional material.

In some embodiments, the two-dimensional material layer may cover the first metal layer, the second metal layer, and a portion of the substrate between the first metal layer and the second metal layer.

According to an embodiment, a method of forming a two-dimensional material layer structure may include preparing a substrate in which a trench is formed; forming a first metal layer including a transition metal on an inner wall of the trench; forming a second metal layer including gold (Au) to cover the first metal layer; diffusing a chalcogen element into the second metal layer; forming a two-dimensional material layer including a transition metal dichalcogenide (TMD) by reacting the chalcogen element with the first metal layer; and removing the second metal layer.

In some embodiments, the first metal layer may be deposited on the inner wall of the trench by atomic layer deposition (ALD), and the first layer may have a uniform thickness.

In some embodiments, the transition metal may include at least one selected from the group consisting of Mo, W, Nb, V, Ta, Ti, Zr, Hf, Co, Tc, and Re. The chalcogen element may include at least one selected from the group consisting of S, Se, and Te.

In some embodiment, the forming the two-dimensional material layer may include suppling the chalcogen element to an upper portion of the second metal layer and diffusing the chalcogen element through the second metal layer during a heat treatment process.

In some embodiments, during the forming the two-dimensional material layer, the chalcogen element may be supplied to the upper portion of the second metal layer by providing a chalcogen precursor containing the chalcogen element to the upper portion of the second metal layer.

In some embodiments, during the forming the two-dimensional material layer, the heat treatment process may be performed at a process temperature of about 500° C. to about 1000° C.

In some embodiments, a semiconductor structure may include the two-dimensional material layer structure formed by the method described above.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a cross-sectional view illustrating an electronic device according to an example embodiment;

FIG. 2 is a schematic plan view illustrating the electronic device shown in FIG. 1;

FIGS. 3A to 3D are views illustrating a method of fabricating an electronic device, according to an example embodiment;

FIGS. 4A to 4C are images of regions A, B, and C of FIG. 3C, which are captured using an electron microscope;

FIGS. 7A and 7B are views illustrating a method of forming a two-dimensional material layer, according to a comparative example;

FIGS. 14A to 14C are views illustrating a method of fabricating an electronic device, according to another example embodiment;

FIGS. 15A to 15C are views illustrating a method of forming a two-dimensional material layer, according to another example embodiment;

FIG. 16A is a schematic plan view illustrating an electronic device according to an example embodiment.

DETAILED DESCRIPTION

Figure 3A:
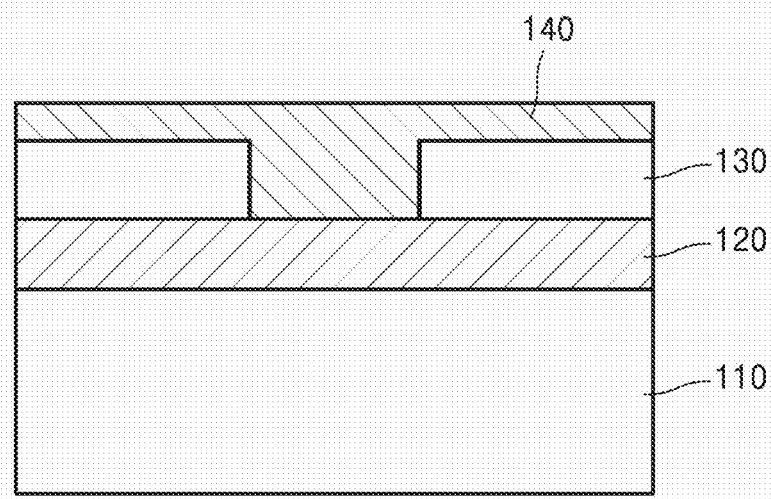

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or exemplary terms are just used herein to describe technical ideas and should not be considered for purposes of limitation unless defined by the claims.

FIG. 1 is a cross-sectional view illustrating an electronic device 100 according to an example embodiment. FIG. 2 is a schematic plan view illustrating the electronic device 100 shown in FIG. 1.

Referring to FIGS. 1 and 2, a first metal layer 120 is provided on a substrate 110. The first metal layer 120 may include a transition metal. The transition metal may include, for example, at least one selected from the group consisting of Mo, W, Nb, V, Ta, Ti, Zr, Hf, Co, Tc, and Re. However, the transition metal is not limited thereto. The substrate 110 may include a nonmetallic material. For example, the substrate 110 may include, but is not limited to, silicon oxide, aluminum oxide, hafnium oxide, or quartz.

A second metal layer 140 is provided on the first metal layer 120. The second metal layer 140 may include gold (Au). In addition, a two-dimensional material layer 150 is provided between the first metal layer 120 and the second metal layer 140. Here, the two-dimensional material layer 150 may include a transition metal dichalcogenide (TMD).

The term "two-dimensional material" refers to a material having a two-dimensional crystal structure which may include a monolayer or multiple layers. Each layer forming a two-dimensional material may have an atomic-level thickness.

The term "TMD" refers to a two-dimensional material which is a compound of a transition metal and a chalcogen element and has semiconductor properties. Here, the transition metal may include at least one selected from the group consisting of Mo, W, Nb, V, Ta, Ti, Zr, Hf, Co, Tc, and Re as described above, but is not limited thereto. The chalcogen element may include, for example, at least one selected from the group consisting of S, Se, and Te. However, the chalcogen element is not limited thereto. Examples of TMDs may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$.

As described later, the two-dimensional material layer 150 including a TMD may be formed as a chalcogen element diffuses into the gold of the second metal layer 140 and reacts with the transition metal of the first metal layer 120. Therefore, the two-dimensional material layer 150 may be formed as a TMD grows in a lateral orientation between the first metal layer 120 and the second metal layer 140. Here, the two-dimensional material layer 150 may include a single-material layer formed of a single two-dimensional material. Alternatively, as described layer, the two-dimensional material layer 150 may include a composite-material layer having a heterojunction structure including different two-dimensional materials.

The two-dimensional material layer 150 and the second metal layer 140 arranged on the two-dimensional material layer 150 may be formed in a desired and/or alternatively predetermined pattern. To this end, a barrier layer 130 may be provided around the two-dimensional material layer 150 and the second metal layer 140. The barrier layer 130 may include a material capable of limiting and/or preventing diffusion of the chalcogen element. For example, the barrier layer 130 may include, but is not limited to, silicon oxide, aluminum oxide, hafnium oxide, or quartz.

As shown in FIG. 2, the second metal layer 140 may cross the first metal layer 120, and the two-dimensional material layer 150 including a TMD may be provided at a crossing therebetween. In this case, the two-dimensional material layer 150 may form a channel which connects the first metal layer 120 and the second metal layer 140 to each other in a direction perpendicular to the growth direction of the two-dimensional material layer 150.

Hereinafter, a method of fabricating the electronic device 100 will be described. FIG. 3A to 3D are views illustrating a method of fabricating an electronic device according to an example embodiment.

Referring to FIG. 3A, a first metal layer 120 including a transition metal is formed on a substrate 110. Here, the first metal layer 120 may be formed by depositing the transition metal on the substrate 110. The substrate 110 may include, for example, a nonmetallic material such as silicon oxide, aluminum oxide, hafnium oxide, or quartz. The transition metal may include, for example, at least one selected from the group consisting of Mo, W, Nb, V, Ta, Ti, Zr, Hf, Co, Tc, and Re, but is not limited thereto. For example, the transition metal may be deposited on the substrate 110 by a physical vapor deposition (PVD) method such as E-beam evaporation, thermal evaporation, or sputtering. The first metal layer 120 may be formed to a thickness of, for example, about 20 nm or less, but this is merely an example.

A barrier layer 130 may be formed on the first metal layer 120. The barrier layer 130 may be formed by depositing a nonmetallic material on the first metal layer 120 and then patterning the nonmetallic material. Here, the barrier layer 130 may include a material capable of limiting and/or preventing diffusion of a chalcogen element. For example, the barrier layer 130 may include, but is not limited to, a nonmetallic material such as silicon oxide, aluminum oxide, hafnium oxide, or quartz.

A second metal layer 140 is formed to cover the barrier layer 130 and the first metal layer 120 which is exposed through the barrier layer 130. Here, the second metal layer 140 may be formed by depositing gold (Au) on the second barrier layer 130 and the first metal layer 120 exposed through the barrier layer 130. The deposition of gold (Au) may be performed by, for example, PVD, but is not limited thereto. The second metal layer 140 may be formed to a thickness of, for example, about 100 nm or less, but this is merely an example.

Referring to FIG. 3B, a chalcogen element is diffused into the gold (Au) of the second metal layer 140. The chalcogen element may include, for example, at least one selected from the group consisting of S, Se, and Te. However, the chalcogen element is not limited thereto.

The chalcogen element may be diffused into the gold (Au) of the second metal layer 140 as follows. After supplying a material (chalcogen precursor) containing a chalcogen element to an upper portion of the second metal layer 140, a heat treatment process is performed. Here, the heat treatment process may be performed, for example, at about 500° C. to about 1000° C. However, the heat treatment process is not limited thereto. After the chalcogen element is separated from the chalcogen precursor by the heat treatment process, the chalcogen element may be diffused into the gold (Au) of the second metal layer 140. Here, the chalcogen element may be diffused along grain boundaries in the gold (Au) of the second metal layer 140. The chalcogen element diffused into the gold (Au) of the second metal layer 140 as described above may move to a lower portion of the second metal layer 140 and may then react with the transition metal in an upper portion of the first metal layer 120.

The transition metal of the first metal layer 120 may be diffused into the gold (Au) of the second metal layer 140 by the heat treatment process described above. In this case, the transition metal diffused into the gold (Au) may move to an upper portion of the second metal layer 140 and may then react with the chalcogen element in the upper portion of the second metal layer 140.

Referring to FIG. 3C, after the chalcogen element moves to the lower portion of the second metal layer 140 by the heat treatment process, the chalcogen element may react with the transition metal in the upper portion of the first metal layer 120, such that a two-dimensional material layer 150 including a TMD may be formed between the first metal layer 120 and the second metal layer 140. The TMD may grow between the first metal layer 120 and the second metal layer 140 in a lateral direction parallel to the surface of the substrate 110. Here, the two-dimensional material layer 150 may be an interfacial two-dimensional material layer formed at the interface between the first metal layer 120 and the second metal layer 140.

The TMD may include a compound of the transition metal and the chalcogen element. Examples of the TMD may include, but are not limited to, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like.

After the transition metal of the first metal layer 120 moves to the upper portion of the second metal layer 140 by the heat treatment process, the transition metal may react with the chalcogen element in the upper portion of the second metal layer 140, such that a surface two-dimensional material layer 160 may be further formed on an upper surface of the second metal layer 140. Here, the surface two-dimensional material layer 160 may include the same two-dimensional material as the two-dimensional material layer 150 formed at the interface between the first metal layer 120 and the second metal layer 140. Due to a diffusion rate difference, the surface two-dimensional material layer 160 may be thinner than the two-dimensional material layer 150 formed at the interface between the first metal layer 120 and the second metal layer 140. In addition, a portion of the second metal layer 140 remaining on the barrier layer 130 may be removed by the heat treatment process described above.

Referring to FIG. 3D, fabrication of an electronic device 100 may be completed by removing the surface two-dimensional material layer 160 from the upper surface of the second metal layer 140.

Figure 4A:
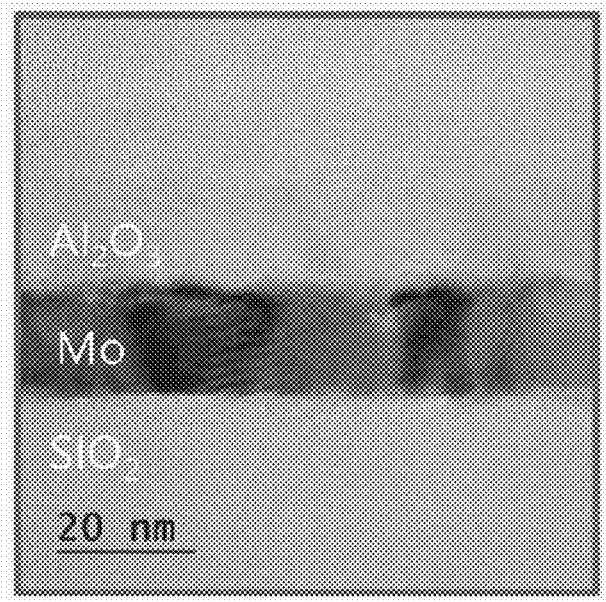
Figure 4C:
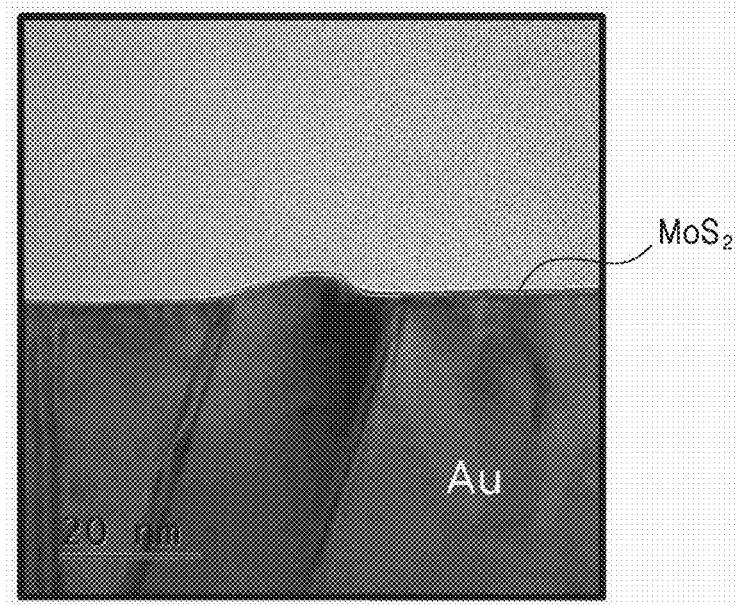

FIGS. 4A to 4C respectively show images of regions A, B, and C of FIG. 3C, which were captured using an electron microscope. Here, an $SiO_2$ substrate was used as the substrate 110. The first metal layer 120 includes molybdenum (Mo), and the barrier layer 130 includes $Al_2O_3$. In addition, sulfur (S) was used as the chalcogen element.

Referring to FIG. 4A showing the region A of FIG. 3C, it will be understood that the two-dimensional material layer 150 is not formed between the first metal layer 120 (Mo) and the barrier layer 130 ($Al_2O_3$) because the diffusion of the chalcogen element (S) is blocked by the barrier layer 130 ($Al_2O_3$). In addition, referring to FIG. 4B showing the region B of FIG. 3C, it will be understood that the two-dimensional material layer 150 ($MoS_2$) is formed at the interface between the first metal layer 120 (Mo) and the second metal layer 140 (Au) because the chalcogen element (S) diffuses into the second metal layer 140 (Au) and reacts with the first metal layer 120 (Mo). In addition, referring to FIG. 4C showing the region C of FIG. 3C, it will be understood that the surface two-dimensional material layer 160 ($MoS_2$) is formed on the upper surface of the second metal layer 140 (Au) because the transition metal (Mo) of the first metal layer 120 diffuses into the second metal layer 140 (Au) and reacts with the chalcogen element (S) in the upper portion of the second metal layer 140.

Figure 5:
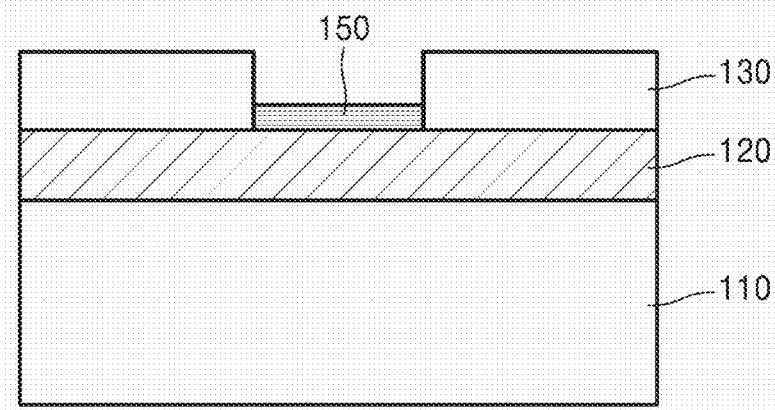
FIG. 5 is a view illustrating a state in which a second metal layer (Au layer) is removed from the electronic device shown in FIG. 3D, for Raman spectrum measurement.

FIG. 5 illustrates a state in which the second metal layer 140 (Au layer) is removed from the structure shown in FIG. 3D for Raman spectrum measurement. FIGS. 6A to 6D show Raman spectra of the two-dimensional material layer 150 shown in FIG. 5.

Figure 6A:
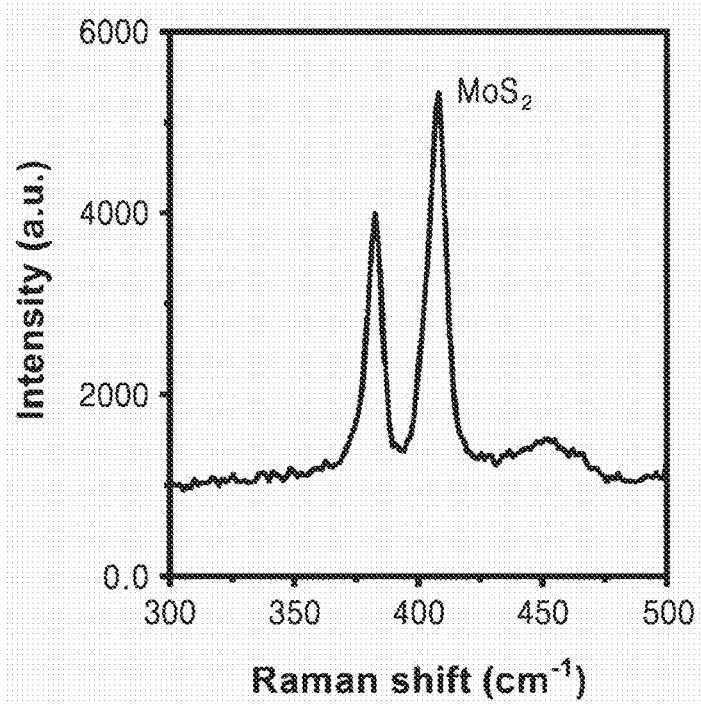
FIGS. 6A to 6D are graphs illustrating Raman spectra of a two-dimensional material layer shown in FIG. 5.
Figure 6B:
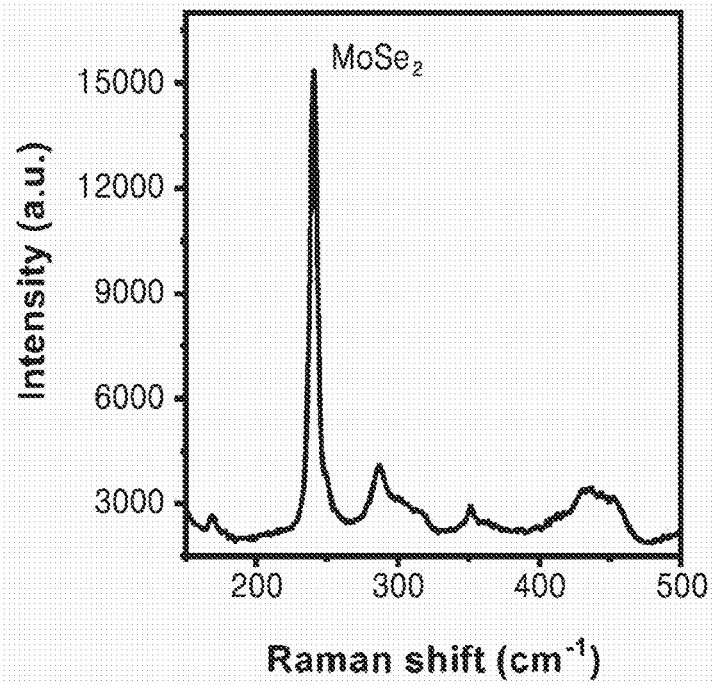

Referring to FIG. 6A, it will be understood that a two-dimensional material layer 150 including $MoS_2$ is formed at the interface between the first metal layer 120 and the second metal layer 140 when the first metal layer 120 includes molybdenum (Mo), and sulfur (S) is used as the chalcogen element. Referring to FIG. 6B, it will be understood that a two-dimensional material layer 150 including $MoSe_2$ is formed at the interface between the first metal layer 120 and the second metal layer 140 when the first metal layer 120 includes molybdenum (Mo), and selenium (Se) is used as the chalcogen element.

Figure 6C:
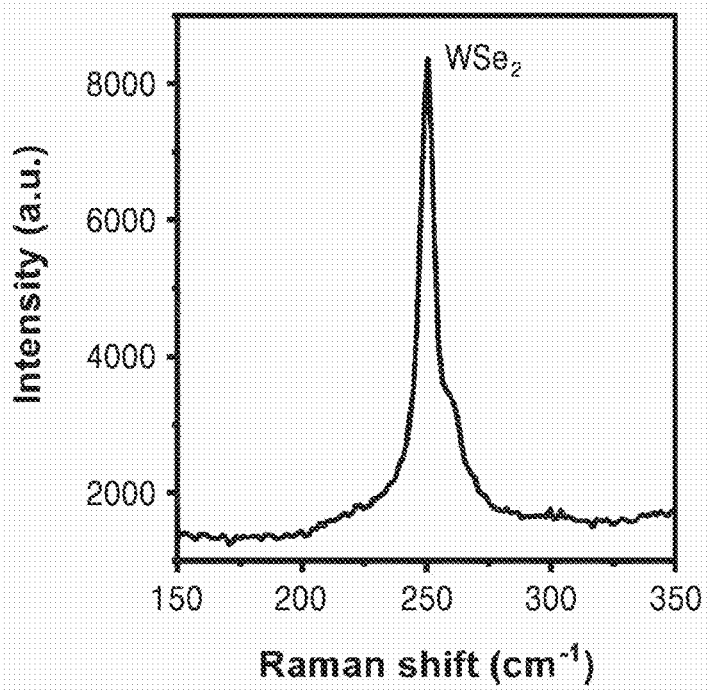
Figure 6D:
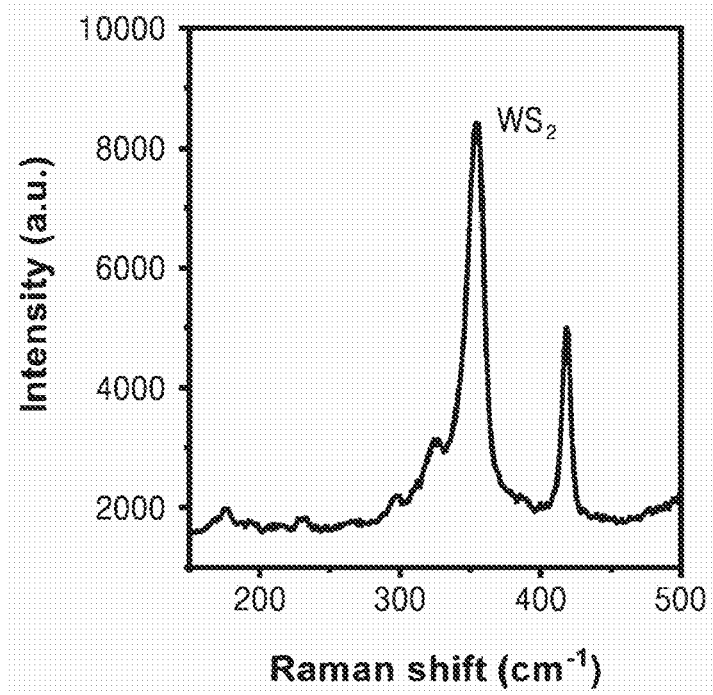

Referring to FIG. 6C, it will be understood that a two-dimensional material layer 150 including $WSe_2$ is formed at the interface between the first metal layer 120 and the second metal layer 140 when the first metal layer 120 includes tungsten (W), and selenium (Se) is used as the chalcogen element. Referring to FIG. 6D, it will be understood that a two-dimensional material layer 150 including $WS_2$ is formed at the interface between the first metal layer 120 and the second metal layer 140 when the first metal layer 120 includes tungsten (W), and sulfur (S) is used as the chalcogen element.

According to the example embodiments, the two-dimensional material layer 150 including a TMD may be formed between the first metal layer 120 including a transition metal and the second metal layer 140 including gold (Au) by diffusing a chalcogen element into the gold (Au) of the second metal layer 140. Here, the two-dimensional material layer 150 may include various two-dimensional materials according to combinations of a transition metal and a chalcogen element.

As described later, the two-dimensional material layer 150 may be grown in a state in which the two-dimensional material layer 150 is not exposed to the outside owing to the first metal layer 120 and the second metal layer 140, the two-dimensional material layer 150 may have a low defect density and may thus improve the characteristics of the electronic device 100. In addition, because the two-dimensional material layer 150 is grown in a lateral orientation between the first metal layer 120 and the second metal layer 140, the crystal orientation of the two-dimensional material layer 150 may be easily controlled.

Figure 7B:
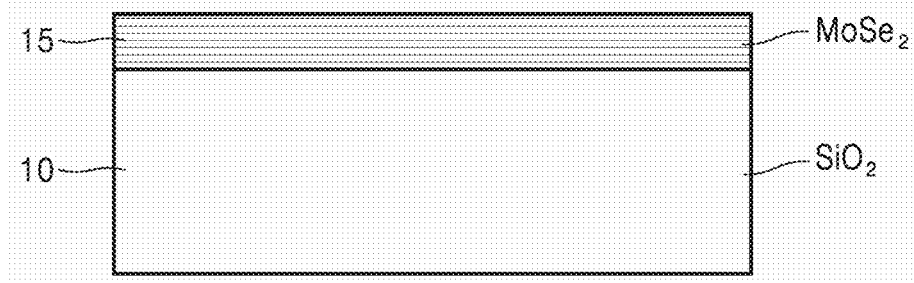

FIGS. 7A and 7B illustrate a method of forming a two-dimensional material layer according to a comparative example. Referring to FIG. 7A, a Mo metal layer 12 is deposited on a $SiO_2$ substrate 10. Referring to FIG. 7B, a $MoSe_2$ two-dimensional material layer 15 is grown by allowing the Mo metal layer 12 to react with a chalcogen element (Se).

Figure 8:
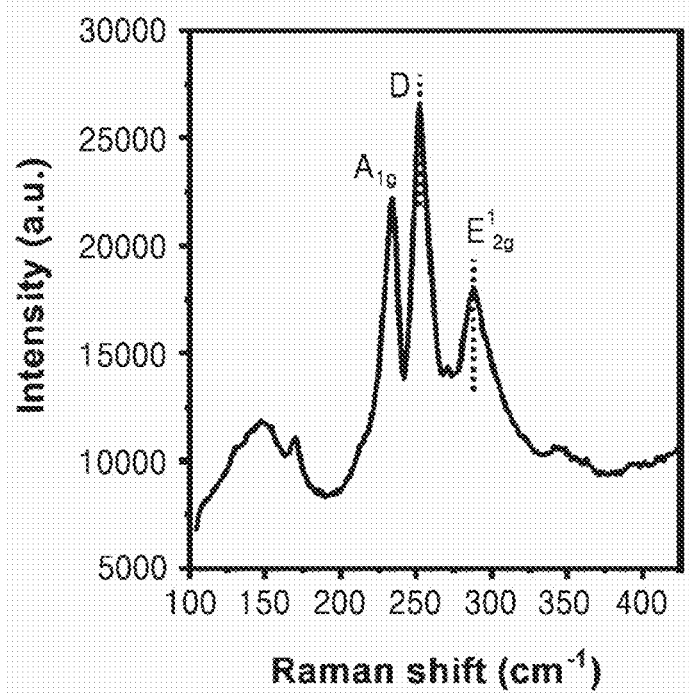
FIG. 8 is a graph illustrating a Raman spectrum of the two-dimensional material layer shown in FIG. 7B.

FIG. 8 shows a Raman spectrum of the $MoSe_2$ two-dimensional material layer 15 shown in FIG. 7B. Referring to FIG. 8, a D-peak observed in the Raman spectrum shows that the $MoSe_2$ two-dimensional material layer 15 has a high defect density. Such defects may occur when the MoSe$_2$ two-dimensional material layer 15 is grown in a state in which the MoSe$_2$ two-dimensional material layer 15 is exposed to the outside, and may also occur in a subsequent process such as a transfer process or a high-temperature process for fabricating an electronic device.

Figure 9A:
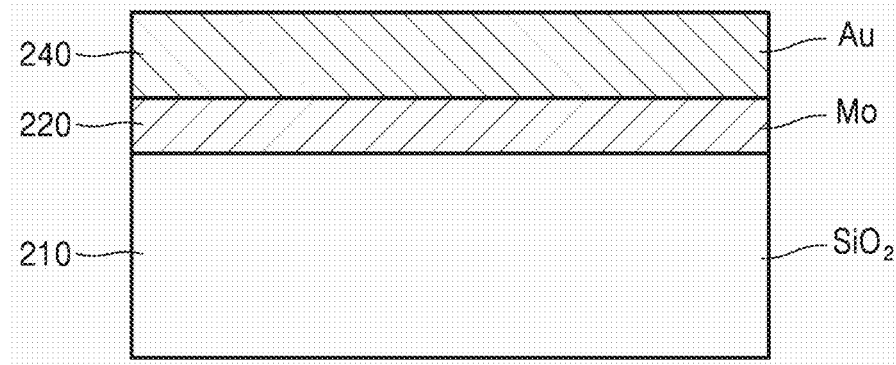
FIGS. 9A and 9B are views illustrating a method of forming a two-dimensional material layer, according to an example embodiment.
Figure 9B:
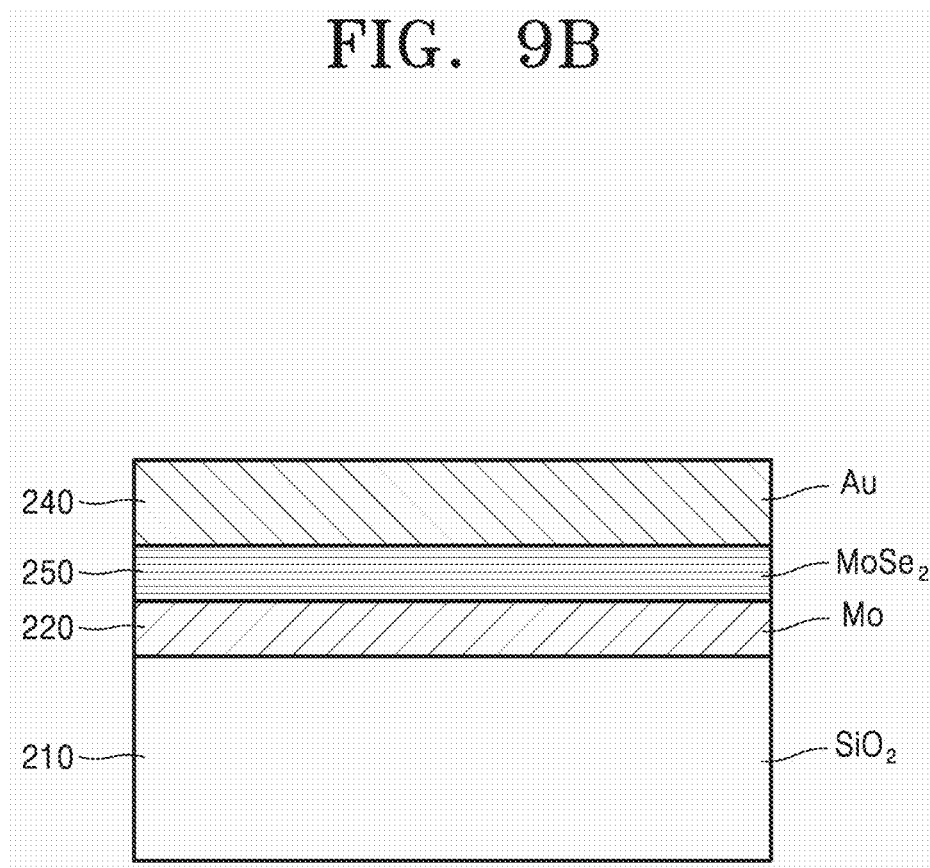

FIGS. 9A and 9B illustrate a method of forming a two-dimensional material layer according to an embodiment. Referring to FIG. 9A, a Mo metal layer 220 and an Au metal layer 240 are sequentially deposited on a SiO$_2$ substrate 210. Referring to FIG. 9B, a MoSe$_2$ two-dimensional material layer 250 is grown between the Mo metal layer 220 and the Au metal layer 240 by diffusing a chalcogen element (Se) into the Au metal layer 240 through a heat treatment process.

Figure 10:
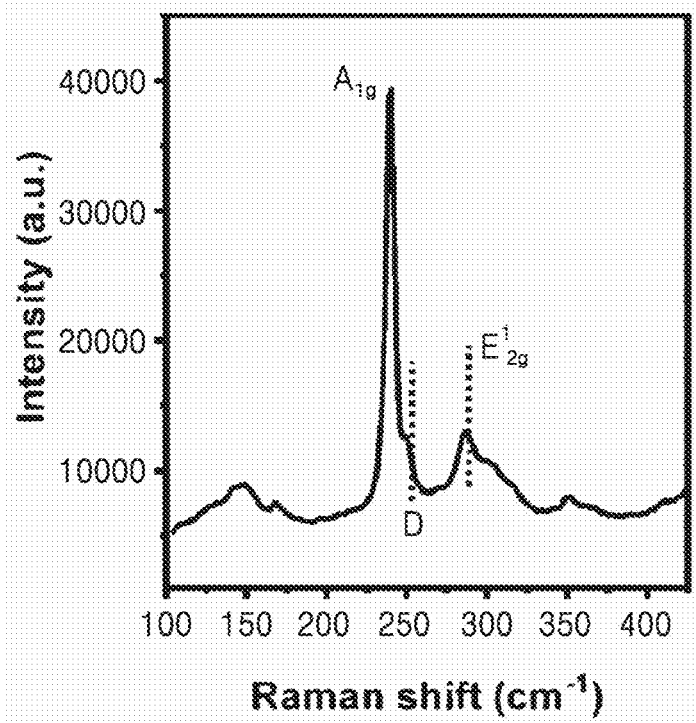
FIG. 10 is a graph illustrating a Raman spectrum of the two-dimensional material layer shown in FIG. 9B.

FIG. 10 shows a Raman spectrum of the MoSe$_2$ two-dimensional material layer 250 shown in FIG. 9B. Referring to FIG. 10, such a D-peak as shown in FIG. 8 is not observed in the Raman spectrum, and thus it will be understood that the MoSe$_2$ two-dimensional material layer 250 has a low defect density. Therefore, it will be understood that the MoSe$_2$ two-dimensional material layer 250 has a low defect density when the MoSe$_2$ two-dimensional material layer 250 is grown in a state in which the MoSe$_2$ two-dimensional material layer 250 is not exposed to the outside owing to the Mo metal layer 220 and the Au metal layer 240.

Figure 11A:
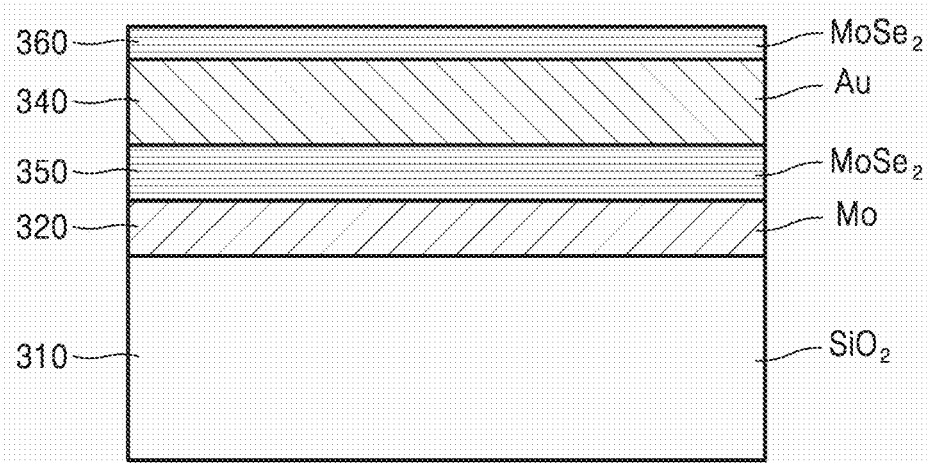
FIGS. 11A to 11C are views illustrating a method of forming a two-dimensional material layer, according to another example embodiment.
Figure 11B:
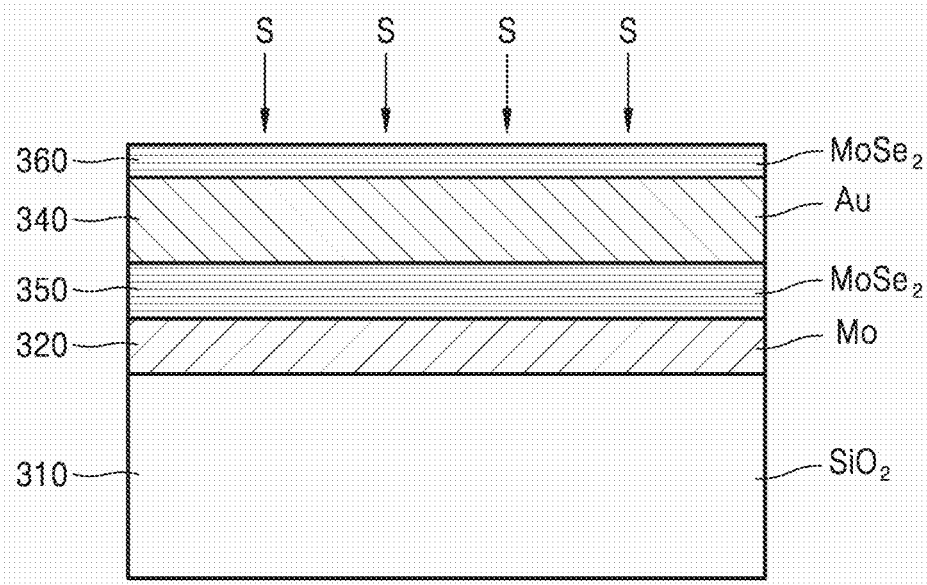
Figure 11C:
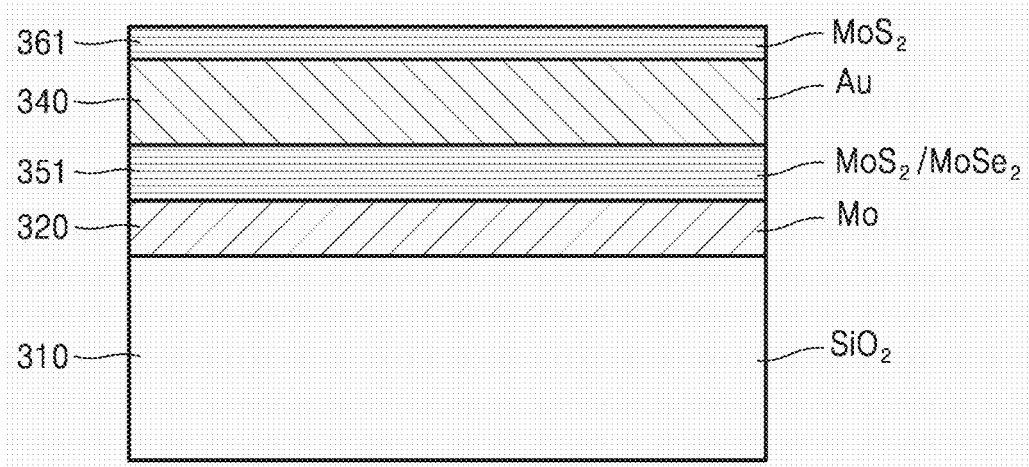

FIGS. 11A to 11C are views illustrating a method of forming a two-dimensional material layer according to another example embodiment. Specifically, FIGS. 11A to 11C illustrate a method of forming a two-dimensional material layer which has a heterojunction structure including different two-dimensional materials. The materials of layers described below are merely examples.

Referring to FIG. 11A, a first metal layer 320 including molybdenum (Mo) is formed on a substrate 310 including SiO$_2$, and a second metal layer 340 including gold (Au) is formed on the first metal layer 320. In addition, a two-dimensional material layer 350 including MoSe$_2$ is formed between the first metal layer 320 and the second metal layer 340, and a surface two-dimensional material layer 360 including MoSe$_2$ is formed on an upper surface of the second metal layer 340. Because the formation of the two-dimensional material layer 350 and the formation of the surface two-dimensional material layer 360 have been described above, descriptions thereof will not be presented here.

Referring to FIG. 11B, a heat treatment process is performed while supplying a chalcogen element including sulfur (S) to an upper portion of the surface two-dimensional material layer 360 including MoSe$_2$. In this case, because sulfur (S) has higher reactivity to molybdenum (Mo) than the reactivity of selenium (Se) to molybdenum (Mo), the selenium (Se) of the surface two-dimensional material layer 360 exposed to the outside may be is substituted with the sulfur (S), and thus the surface two-dimensional material layer 360 including MoSe$_2$ may be converted into a surface two-dimensional material layer 361 including MoS$_2$.

In addition, the chalcogen element including sulfur (S) may diffuse into the gold (Au) of the second metal layer 340 and react with the molybdenum (Mo) of the two-dimensional material 350, and thus the two-dimensional material layer 350 including MoSe$_2$ formed at the interface between the first metal layer 320 and the second metal layer 340 may be converted into a two-dimensional material layer 351 having a heterojunction structure including MoS$_2$/MoSe$_2$.

Figure 12A:
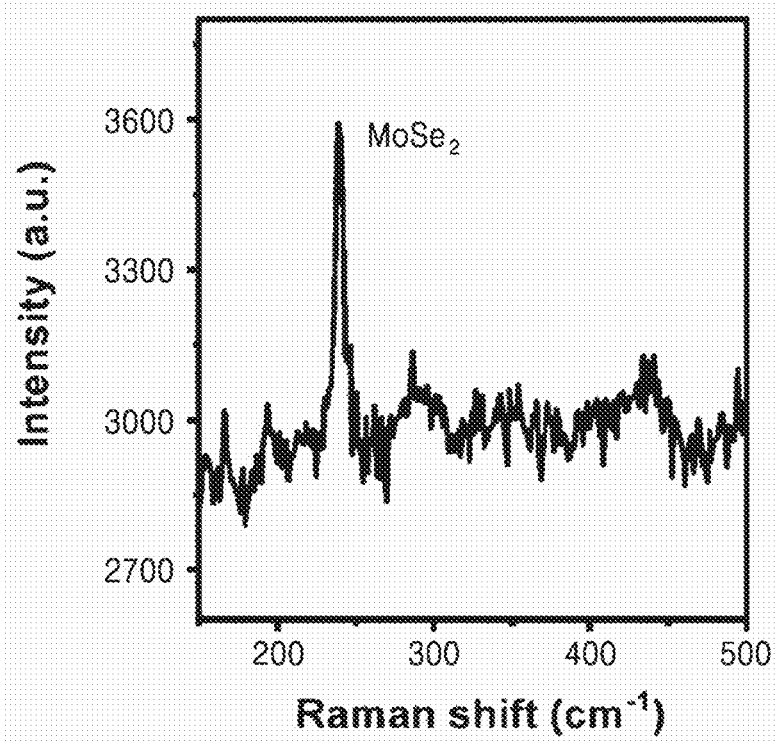
FIG. 12A is a graph illustrating a Raman spectrum of a surface two-dimensional material layer formed on an upper surface of a second metal layer in FIG. 11A.
Figure 12B:
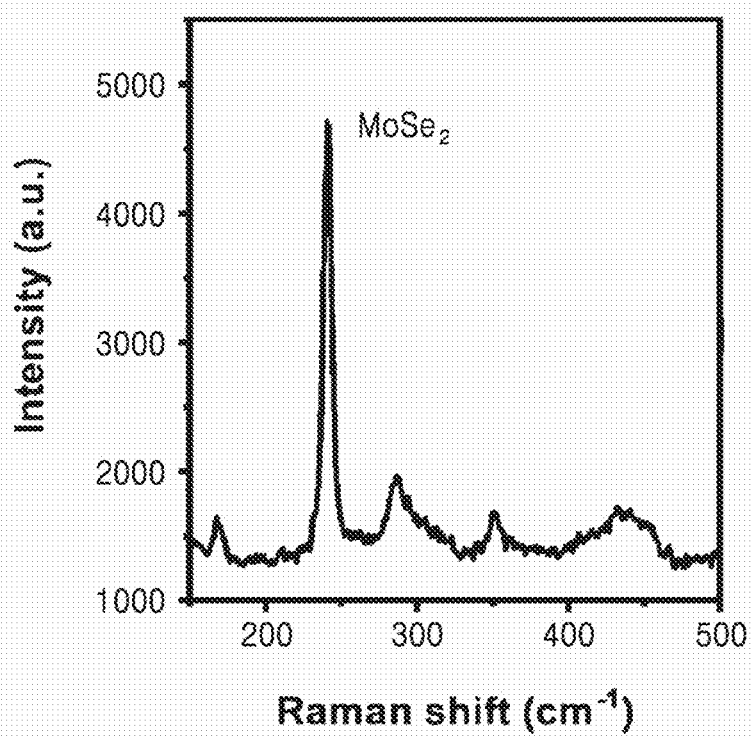
FIG. 12B is a graph illustrating a Raman spectrum of a two-dimensional material layer formed between a first metal layer and the second metal layer in FIG. 11A.

FIG. 12A shows a Raman spectrum of the surface two-dimensional material layer 360 formed on the upper surface of the second metal layer 340 in FIG. 11A, and FIG. 12B shows a Raman spectrum of the two-dimensional material layer 350 formed between the first metal layer 320 and the second metal layer 340 in FIG. 11A. In addition, FIG. 12C shows a Raman spectrum of the surface two-dimensional material layer 361 formed on the upper surface of the second metal layer 340 in FIG. 11C, and FIG. 12D shows a Raman spectrum of the two-dimensional material layer 351 formed between the first metal layer 320 and the second metal layer 340 in FIG. 11C.

Figure 12C:
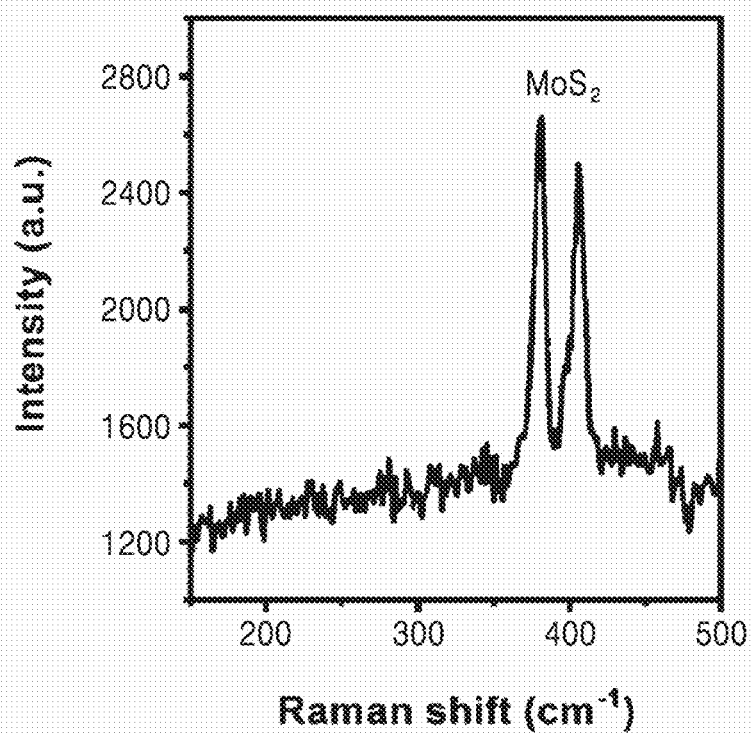
FIG. 12C is a graph illustrating a Raman spectrum of a surface two-dimensional material layer formed on the upper surface of the second metal layer in FIG. 11C.
Figure 12D:
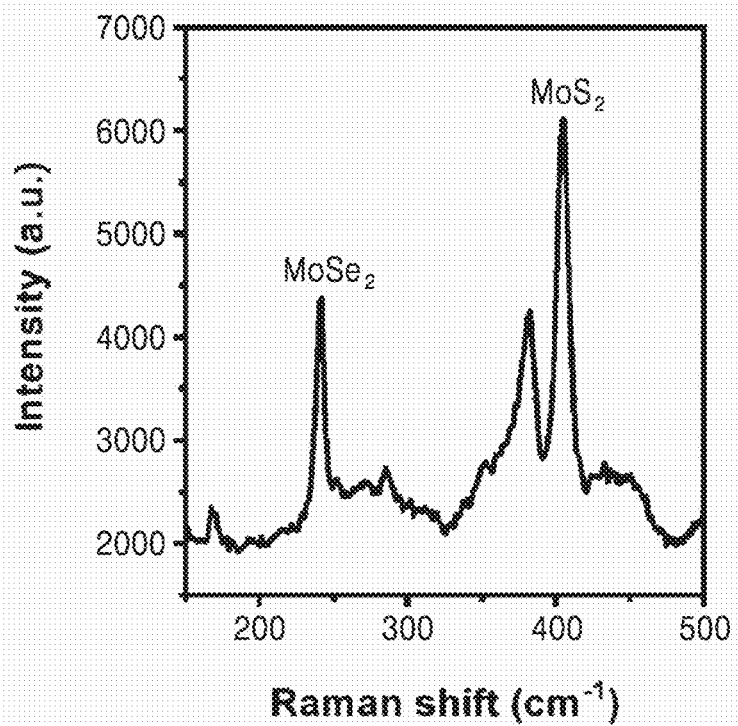
FIG. 12D is a graph illustrating a Raman spectrum of a two-dimensional material layer formed between the first metal layer and the second metal layer in FIG. 11C.

Referring to FIGS. 12A and 12C, it will be understood that the surface two-dimensional material layer 360 including MoSe$_2$ and formed on the upper surface of the second metal layer 340 including Au is converted into the two-dimensional material layer 361 including MoS$_2$. In addition, referring to FIGS. 12B and 12D, it will be understood that the two-dimensional material layer 350 including MoSe$_2$ and formed between the first metal layer 320 including molybdenum (Mo) and the second metal layer 340 including gold (Au) is converted into the two-dimensional material layer 351 having a heterojunction structure including MoS$_2$/MoSe$_2$.

Figure 13:
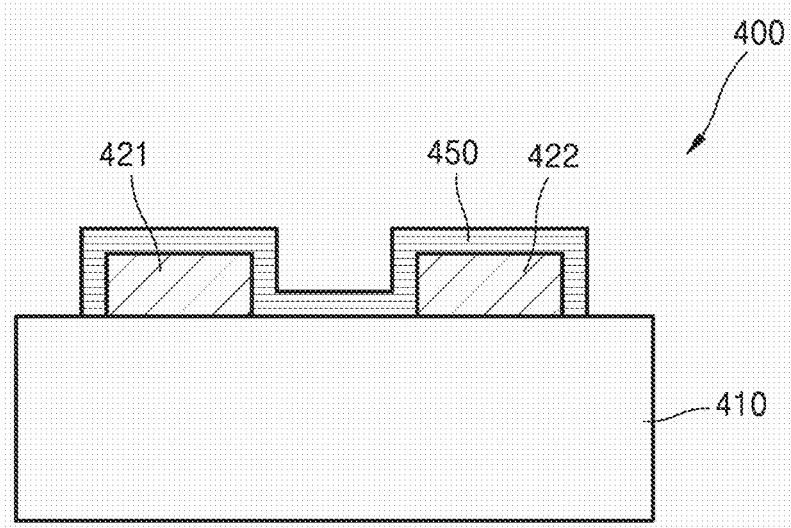
FIG. 13 is a view illustrating an electronic device according to another example embodiment.

FIG. 13 illustrates an electronic device 400 according to another example embodiment.

Referring to FIG. 13, first and second metal layers 421 and 422 are formed apart from each other on a substrate 410. For example, the substrate 410 may include, but is not limited to, a nonmetallic material such as silicon oxide, aluminum oxide, hafnium oxide, or quartz.

The first and second metal layers 421 and 422 may include a transition metal. The transition metal may include, for example, at least one selected from the group consisting of Mo, W, Nb, V, Ta, Ti, Zr, Hf, Co, Tc, and Re, but is not limited thereto.

The first metal layer 421 and the second metal layer 422 are electrically connected to each other through a two-dimensional material layer 450 including a TMD. The two-dimensional material layer 450 is formed such that the two-dimensional material layer 450 may cover the first and second metal layers 421 and 422 and a portion of the substrate 410 between the first and second metal layers 421 and 422. Here, the two-dimensional material layer 450 may form a channel which connects together the first metal layer 421 and the second metal layer 422 in a direction parallel to the growth direction of the two-dimensional material layer 450 (that is, in a direction parallel to the surface of the substrate 410). The TMD may include a compound of a transition metal and a chalcogen element. For example, the TMD may include, but is not limited to, MoS$_2$, MoSe$_2$, MoTe$_2$, WS$_2$, WSe$_2$, WTe$_2$, ZrS$_2$, ZrSe$_2$, HfS$_2$, HfSe$_2$, NbSe$_2$, ReSe$_2$, or the like.

Figure 14A:
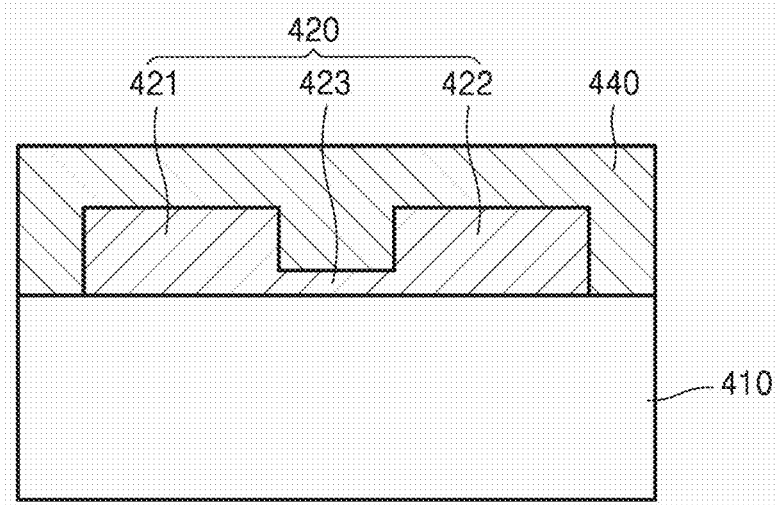

Hereinafter, a method of fabricating the electronic device 400 shown in FIG. 13 will be described. FIGS. 14A to 14C illustrate a method of fabricating an electronic device 400 according to another example embodiment.

Referring to FIG. 14A, a transition metal layer 420 is deposited on a substrate 410. The transition metal layer 420 may include: first and second metal layers 421 and 422; and a third metal layer 423 which connects the first and second metal layers 421 and 422 to each other. Here, the third metal layer 423 may have a thickness such that all the transition metal of the third metal layer 423 may react with a chalcogen element and may thus be converted into a two-dimensional material in a subsequent process (described later). To this end, the third metal layer 423 may be thinner than the first and second metal layers 421 and 422.

Referring to FIG. 14B, a fourth metal layer 440 including gold (Au) is deposited to cover the transition metal layer 420. Thereafter, a chalcogen element is diffused into the gold (Au) of the fourth metal layer 440 through a heat treatment process. The chalcogen element may include, for example, at least one selected from the group consisting of S, Se, and Te. However, the chalcogen element is not limited thereto.

Referring to FIG. 14C, the chalcogen element diffused into the fourth metal layer 440 reacts with the transition metal of the first, second, and third metal layers 421, 422, and 423, thereby forming a two-dimensional material layer 450 including a TMD. Here, because the third metal layer 423 has a small thickness as described above, all the transition metal of the third metal layer 423 may react with the chalcogen element, and thus the two-dimensional material layer 450 may be formed. In addition, the transition metal of the first and second metal layers 421 and 422 may partially react with the chalcogen element, and thus the two-dimensional material layer 450 may be formed on surfaces of the first and second metal layers 421 and 422. The fabrication of the electronic device 400 may be completed by removing the fourth metal layer 440 remaining on the two-dimensional material layer 450.

Figure 15A:
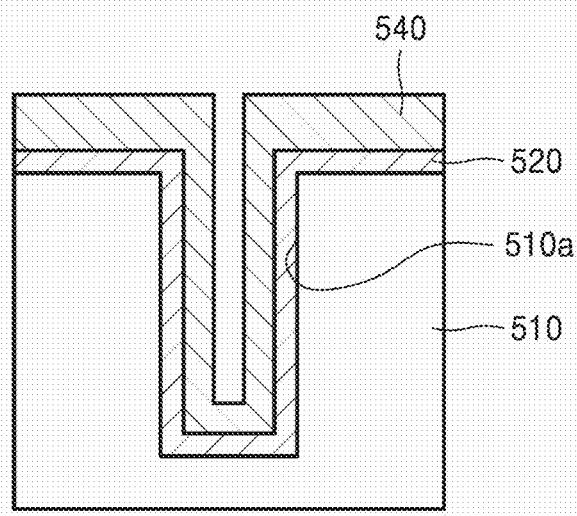
Figure 15C:
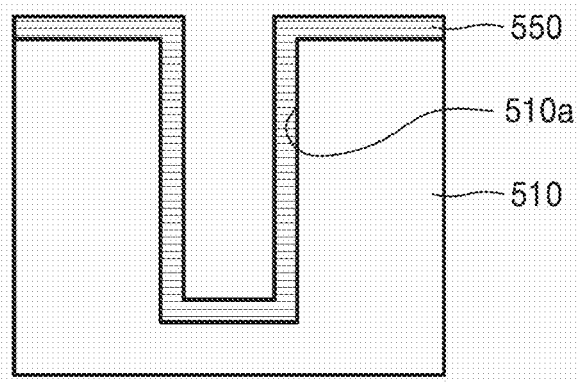

FIGS. 15A to 15C are views illustrating a method of forming a two-dimensional material layer according to another example embodiment.

Referring to FIG. 15A, a substrate 510 on which a trench 510a is formed is prepared. Next, a first metal layer 520 including a transition metal is formed on a surface of the substrate 510 and an inner wall of the trench 510a. Here, the first metal layer 520 may be deposited by atomic layer deposition (ALD). Therefore, the first metal layer 520 may have a uniform thickness along the inner wall of the trench 510a. The first metal layer 520 may have a thickness such that all the transition metal of the first metal layer 520 may react with a chalcogen element and may thus be converted into a two-dimensional material in a subsequent process (described later).

Referring to FIG. 15B, a second metal layer 540 including gold (Au) is deposited to cover the first metal layer 520. Next, a chalcogen element is diffused into the gold (Au) of the second metal layer 540 through a heat treatment process.

Referring to FIG. 15C, the chalcogen element diffused into the second metal layer 540 reacts with the transition metal of the first metal layer 520, and thus a two-dimensional material layer 550 including a TMD is formed. Here, all the transition metal of the first metal layer 520 may react with the chalcogen element, and thus the first metal layer 520 may be converted into the two-dimensional material layer 550. Next, the second metal layer 540 remaining on the two-dimensional material layer 550 may be removed.

According to the present embodiment, the first metal layer 520 is formed on the inner wall of the trench 510a of the substrate 510 by ALD, and then the first metal layer 520 is converted into the two-dimensional material layer 550, such that the two-dimensional material layer 550 may be formed on the inner wall of the trench 510a and may have a uniform thickness.

Figure 16B:
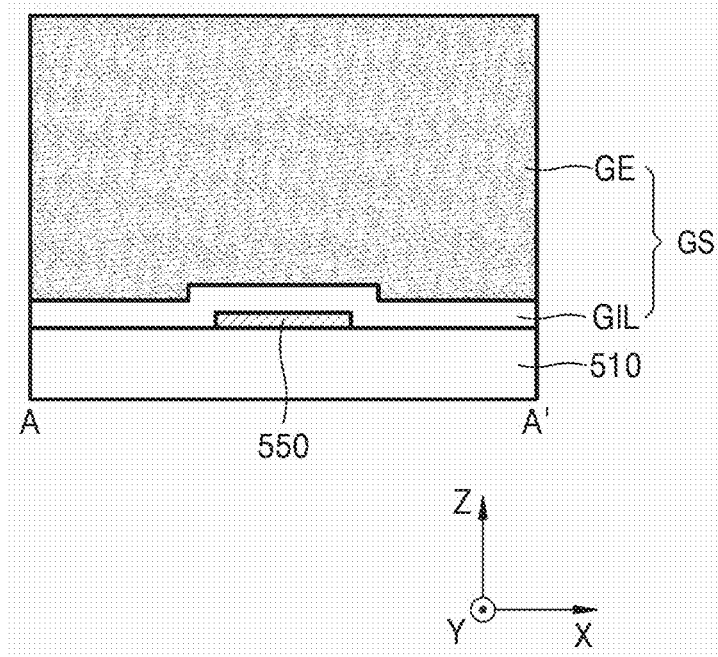
FIGS. 16B and 16C are cross-sectional views taken along lines A-A' and B-B' in FIG. 16A.
Figure 16C:
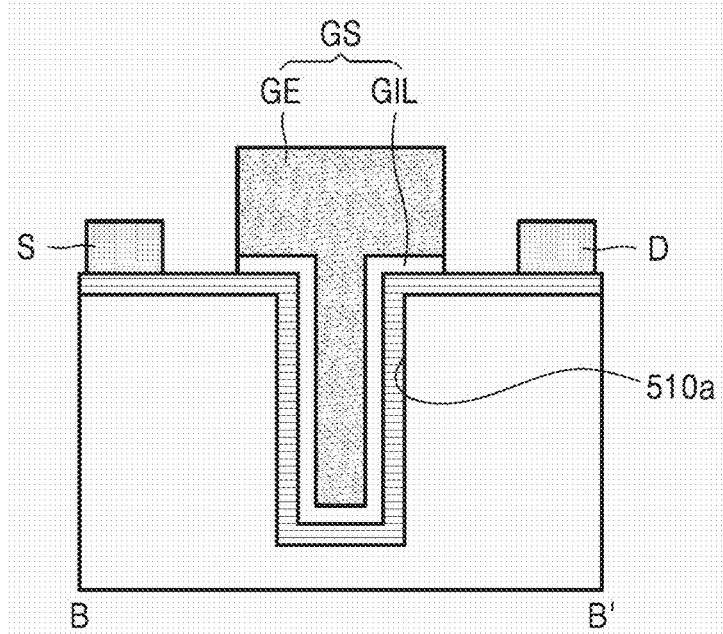

FIG. 16A is a schematic plan view illustrating an electronic device according to an example embodiment. FIGS. 16B and 16C are cross-sectional views taken along lines A-A' and B-B' in FIG. 16A.

Referring to FIGS. 16A, 16B, and 16C, an electronic device according to an example embodiment may include the substrate 510, a two-dimensional material layer 550, a gate structure GS, a source electrode S, and a drain electrode D. The device may be a buried transistor.

The substrate 510 may have include the trench 510a recessed from a main surface of the substrate 510. The trench 510a may extend in the first direction X. The two-dimensional material layer 550 may extend in the second direction Y. The two-dimensional material layer 550 may be formed according to the process described above in FIGS. 15A to 15C so a duplicate description is omitted for brevity.

As shown in FIG. 15C, the two-dimensional material layer 550 may include a first portion on a lower surface of the trench 510a of the substrate 510, a second portion on an inner wall (e.g., sidewall) of the trench 510a of the substrate 510, and a third portion on the main surface (e.g., upper surface) of the substrate 510.

Referring to FIGS. 15C and 16A to 16C, after the second metal 540 is removed (see FIG. 15C), a gate insulating film (not shown) including an insulating material (e.g., silicon oxide, hafnium oxide) may be formed to cover the first portion, the second portion, and the third portion of the two-dimensional material layer 550. The gate insulating film may be patterned to provide the gate insulating layer GIL shown in FIGS. 16A to 16C by removing portions of the gate insulating film.

After forming the gate insulating layer GIL, the gate electrode GE may be formed on the gate insulating layer GIL. The source and drain electrodes S and D also may be formed on the two-dimensional material layer 550 and spaced apart from the gate electrode GE. The gate electrode GE, source electrode S, and drain electrode D may be formed by coating a conductive layer on the two-dimensional material layer 550 and the gate insulating layer GIL. Then, the conductive layer may be patterned to provide the source electrode S, gate electrode GE, and drain electrode D shown in FIG. 16C. The source electrode S may be in contact with one end of the two-dimensional material layer 550. The drain electrode D may be in contact with the other end of the two-dimensional material layer 550. The gate structure GS including the gate electrode GE on the gate insulating layer GIL may be between and spaced apart from the source electrode S and the drain electrode D. The gate structure GS may include a portion that extends into the trench 510a. The gate insulating layer GIL may be between the gate electrode GE and the two-dimensional material layer 550

As described above, according to the one or more of the above embodiments, a two-dimensional material layer including a TMD may be formed between a first metal layer including a transition metal and a second metal layer including gold (Au) as a chalcogen element diffuses into the gold (Au) and reacts with the transition metal. The two-dimensional material layer may include various two-dimensional materials according to combinations of the transition metal and the chalcogen element.

Because the two-dimensional material layer is grown in a state in which the two-dimensional material layer is not exposed to the outside owing to the first metal layer and the second metal layer, the two-dimensional material layer may have a low defect density and may thus improve the characteristics of electronic devices. In addition, because the two-dimensional material layer is grown in a lateral orientation between the first metal layer and the second metal layer, the crystal orientation of the two-dimensional material layer may be easily controlled. While embodiments have been described above, the embodiments are merely examples, and those skilled in the art may variously modify the embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a first metal layer including a transition metal;
a second metal layer on the first metal layer and including gold (Au); and
a two-dimensional material layer between the first metal layer and the second metal layer and including a transition metal dichalcogenide (TMD) containing the transition metal of the first metal layer, wherein
the first metal layer and the second metal layer are different materials,
a width of the first metal layer in a first direction is greater than a width of the second metal layer in the first direction,
the first metal layer extends in the first direction,
the second metal layer extends in a second direction,
the second direction crosses the first direction, and
the first direction and the second direction intersect a thickness direction of the first metal layer and a thickness direction of the second metal layer.

2. The electronic device of claim 1, further comprising:
a barrier layer on the first metal layer,
wherein the barrier layer defines an opening over a region of the first metal layer, the two-dimensional material layer is in the opening of the barrier layer, a part of the second metal layer is in the opening of the barrier layer and covers the two-dimensional material layer, and the barrier layer is configured to prevent diffusion of a chalcogen element.

3. The electronic device of claim 1,
wherein the two-dimensional material layer is formed as a chalcogen element diffuses into the second metal layer and reacts with the transition metal of the first metal layer, adjacent to the second metal layer.

4. The electronic device of claim 3,
wherein the transition metal comprises at least one selected from the group consisting of Mo, W, Nb, V, Ta, Ti, Zr, Hf, Co, Tc, and Re.

5. The electronic device of claim 3,
wherein the chalcogen element comprises at least one selected from the group consisting of S, Se, and Te.

6. The electronic device of claim 1, further comprising:
a barrier layer provided around the second metal layer and the two-dimensional material layer, wherein
the barrier layer is configured to prevent diffusion of a chalcogen element.

7. The electronic device of claim 6,
wherein the barrier layer comprises silicon oxide, aluminum oxide, hafnium oxide, or quartz.

8. The electronic device of claim 1,
wherein the two-dimensional material layer comprises a single-material layer or the two-dimensional material layer comprises a composite-material layer comprising different two-dimensional materials.

9. The electronic device of claim 1, further comprising:
a substrate, wherein
the first metal layer and the second metal layer are on the substrate with the two-dimensional material layer therebetween, and
the two-dimensional material layer is parallel to the substrate and connects the first metal layer and the second metal layer to each other.

10. The electronic device of claim 1, wherein
the transition metal comprises at least one selected from the group consisting of Mo, W, Nb, V, Ta, Ti, Zr, Hf, Co, Tc, and Re, and
the two-dimensional material layer comprises at least one chalcogen element selected from the group consisting of S, Se, and Te.

11. An electronic device comprising:
a first metal layer including a transition metal;
a second metal layer on the first metal layer and including gold (Au); and
a two-dimensional material layer between the first metal layer and the second metal layer and including a transition metal dichalcogenide (TMD) containing the transition metal of the first metal layer, wherein
the first metal layer and the second metal layer are different materials,
the first metal layer extends lengthwise in a first direction,
the second metal layer extends lengthwise in a second direction,
the first metal layer and the second metal layer are spaced apart from each other in a third direction with the two-dimensional material layer therebetween,
the first direction, the second direction, and the third direction cross each other, and
the third direction corresponds to a thickness of the two-dimensional material layer.

12. The electronic device of claim 11, further comprising:
a barrier layer provided around the second metal layer and the two-dimensional material layer, wherein
the barrier layer is configured to prevent diffusion of a chalcogen element.

13. A method of fabricating an electronic device, the method comprising:
forming a first metal layer comprising a transition metal on a substrate;
forming a second metal layer comprising gold (Au) on the first metal layer;
diffusing a chalcogen element into the second metal layer; and
forming a two-dimensional material layer comprising a transition metal dichalcogenide (TMD) by reacting the chalcogen element with the transition metal of the first metal layer adjacent to the second metal layer.

14. The method of claim 13, further comprising:
forming a patterned barrier layer on the first metal layer.

15. The method of claim 14,
wherein the second metal layer is formed to cover the patterned barrier layer and a portion of the first metal layer is exposed by the patterned barrier layer through an opening in the patterned barrier layer.

16. The method of claim 13,
wherein the transition metal comprises at least one selected from the group consisting of Mo, W, Nb, V, Ta, Ti, Zr, Hf, Co, Tc, and Re, and
the chalcogen element comprises at least one selected from the group consisting of S, Se, and Te.

17. The method of claim 13, wherein
the substrate includes a trench, and
the forming the first metal layer includes forming the first metal layer comprising the transition metal on an inner wall of the trench.

18. The method of claim 17,
wherein the first metal layer is deposited on the inner wall of the trench by atomic layer deposition (ALD), and the first metal layer has a uniform thickness.

19. The method of claim 17,
wherein the transition metal comprises at least one selected from the group consisting of Mo, W, Nb, V, Ta, Ti, Zr, Hf, Co, Tc, and Re, and
the chalcogen element comprises at least one selected from the group consisting of S, Se, and Te.

20. The method of claim 13,
wherein the forming the two-dimensional material layer includes suppling the chalcogen element to an upper portion of the second metal layer and diffusing the chalcogen element through the second metal layer during a heat treatment process.

21. The method of claim 20, wherein,
during the forming the two-dimensional material layer, the chalcogen element is supplied to the upper portion of the second metal layer by providing a chalcogen precursor containing the chalcogen element to the upper portion of the second metal layer.

22. The method of claim 20, wherein,
during the forming the two-dimensional material layer, the heat treatment process is performed at a process temperature of about 500° C. to about 1000° C.

23. A semiconductor structure comprising:
the electronic device formed by the method of claim 13.

24. The method of claim 13, wherein
the two-dimensional material layer contains the transition metal of the first metal layer,
the first metal layer and the second metal layer are different materials,
a width of the first metal layer in a first direction is greater than a width of the second metal layer in the first direction,
the first metal layer extends in the first direction,
the second metal layer extends in a second direction,
the second direction crosses the first direction, and
the first direction and the second direction intersect a thickness direction of the first metal layer and a thickness direction of the second metal layer.

25. The electronic device of claim 11, wherein
the transition metal comprises at least one selected from the group consisting of Mo, W, Nb, V, Ta, Ti, Zr, Hf, Co, Tc, and Re, and
the two-dimensional material layer comprises at least one chalcogen element selected from the group consisting of S, Se, and Te.

\* \* \* \* \*